United States Patent
Yang et al.

(10) Patent No.: US 8,921,160 B2
(45) Date of Patent: *Dec. 30, 2014

(54) 3D IC CONFIGURATION WITH CONTACTLESS COMMUNICATION

(71) Applicant: Taiwan Semiconductor Manufacturing Co., Ltd., Hsin-Chu (TW)

(72) Inventors: Ping-Lin Yang, Tianzhong Township (TW); Sa-Lly Liu, HsinChu (TW); Chien-Min Lin, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/945,169

(22) Filed: Jul. 18, 2013

(65) Prior Publication Data

US 2013/0302942 A1 Nov. 14, 2013

Related U.S. Application Data

(63) Continuation of application No. 13/337,346, filed on Dec. 27, 2011, now Pat. No. 8,513,795.

(51) Int. Cl.
| | |
|---|---|
| *H01L 21/00* | (2006.01) |
| *H01L 23/48* | (2006.01) |
| *H01L 23/00* | (2006.01) |
| *H01L 25/065* | (2006.01) |
| *H01L 23/367* | (2006.01) |
| *H01L 23/522* | (2006.01) |

(52) U.S. Cl.
CPC ....... *H01L 24/82* (2013.01); *H01L 2224/16225* (2013.01); *H01L 2224/73253* (2013.01); *H01L 23/48* (2013.01); *H01L 2225/06531* (2013.01); *H01L 25/0657* (2013.01); *H01L 2225/06589* (2013.01); *H01L 23/3677* (2013.01); *H01L 2225/06572* (2013.01); *H01L 2224/16227* (2013.01); *H01L 2224/32225* (2013.01); *H01L 24/16* (2013.01); *H01L 2225/06517* (2013.01); *H01L 23/5227* (2013.01); *H01L 2225/06551* (2013.01)
USPC ............................ 438/109; 438/122; 438/107

(58) Field of Classification Search
CPC ..................... H01L 2224/32245; H01L 23/34; H01L 23/50; H01L 2225/06551; H01L 23/3185; H01L 33/62
USPC ............................ 438/15, 122, 107, 108, 109
See application file for complete search history.

(56) References Cited

U.S. PATENT DOCUMENTS

| | | | | |
|---|---|---|---|---|
| 6,188,127 B1 * | 2/2001 | Senba et al. | ................... | 257/686 |
| 7,368,813 B2 * | 5/2008 | Wakisaka et al. | ............. | 257/690 |

(Continued)

OTHER PUBLICATIONS

Asao, Y. et al., "Design and Process Integration for High-Density, High-Speed, and Low-Power 6F2 Cross Point MRAM Cell", IEEE International Electron Devices Meeting, 2004, IEDM Technical Digest, pp. 571-574.

(Continued)

*Primary Examiner* — S. V. Clark
(74) *Attorney, Agent, or Firm* — Duane Morris LLP; Steven E. Koffs

(57) ABSTRACT

A package comprises a die stack having at least two stacked dies coupled for contactless communications with each other. At least one of the stacked dies has a substrate joined to its major face. The substrate has a plurality of conductive traces in or on the substrate for conducting power to the dies and for conducting heat from the dies. At least one conductive pillar is joined to at least one of the conductive traces on at least a first edge of the substrate, for conducting power to the at least one die and for conducting heat from the at least one die.

20 Claims, 10 Drawing Sheets

(56) References Cited

U.S. PATENT DOCUMENTS

| | | | |
|---|---|---|---|
| 7,498,668 B2 * | 3/2009 | Kawabata et al. | 257/686 |
| 7,642,135 B2 | 1/2010 | Liang | |
| 7,656,017 B2 * | 2/2010 | Kim et al. | 257/686 |
| 7,795,713 B2 | 9/2010 | Matsui | |
| 8,039,943 B2 * | 10/2011 | Harayama et al. | 257/686 |
| 8,053,879 B2 * | 11/2011 | Lee et al. | 257/686 |
| 8,202,763 B2 * | 6/2012 | Meyer et al. | 438/108 |
| 8,278,746 B2 * | 10/2012 | Ding et al. | 257/686 |
| 8,513,795 B2 * | 8/2013 | Yang et al. | 257/686 |
| 2009/0155955 A1 | 6/2009 | Liang | |
| 2011/0079903 A1 | 4/2011 | Liu | |
| 2013/0154074 A1 * | 6/2013 | Oh | 257/676 |
| 2013/0299977 A1 * | 11/2013 | Dayringer et al. | 257/738 |

OTHER PUBLICATIONS

Durlam, M. et al., "A 1-Mbit MRAM Based on 1T1MTJ Bit Cell Integrated With Copper Interconnects", IEEE Journal of Solid-State Circuits, May 2003, 38(5):769-773.

Tehrani, S. et al., "Progress and Outlook for MRAM Technology", IEEE Transactions on Magnetics, Sep. 1999, 35(5):2814-2819.

Radecki, A. et al., "6W/25mm2 Inductive Power Transfer for Non-Contact Wafer-Level Testing", IEEE International Solid-State Circuits Conference, 2011, Session 12, Design in Emerging Technologies, 12.8, pp. 230-232.

Han, S. et al., "Performance Improvement of Resonant Inductive Coupling for Wireless 3D IC Interconnect", IEEE Antennas and Propagation Society International Symposium (APSURSI), 2010, pp. 1-4.

Han, S. et al., "Wireless Power Transfer Using Resonant Inductive Coupling for 3D Integrated ICs", Electrical Engineering and Computer Science Department, The University of Michigan, Ann Arbor, pp. 1-5, www.eecs.umich.edu/wics/publications.html—Cached, 2010.

Hsieh, A.C. et al., "TSV Redundancy: Architecture and Design Issues in 3D IC", Design, Automation & Test in Europe Conference & Exhibition, 2010, pp. 166-171.

Motoyoshi, M., "Through-Silicon Via (TSV)", Proceedings of the IEEE, Jan. 2009, 97(1):43-48.

U.S. Appl. No. 13/206,584, filed Aug. 10, 2011.

* cited by examiner

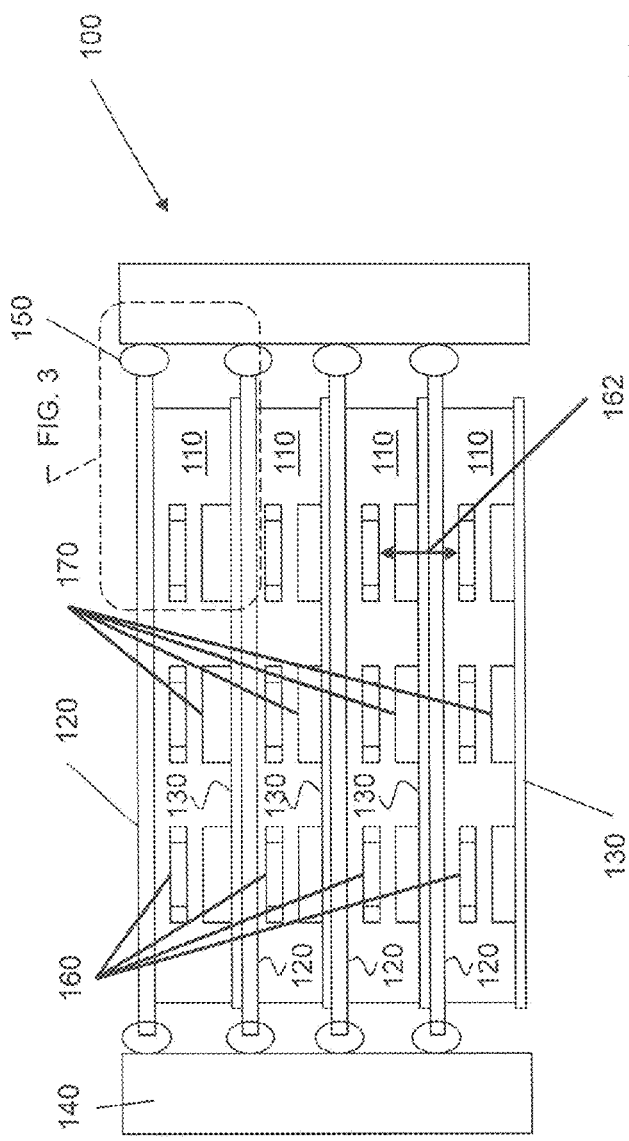
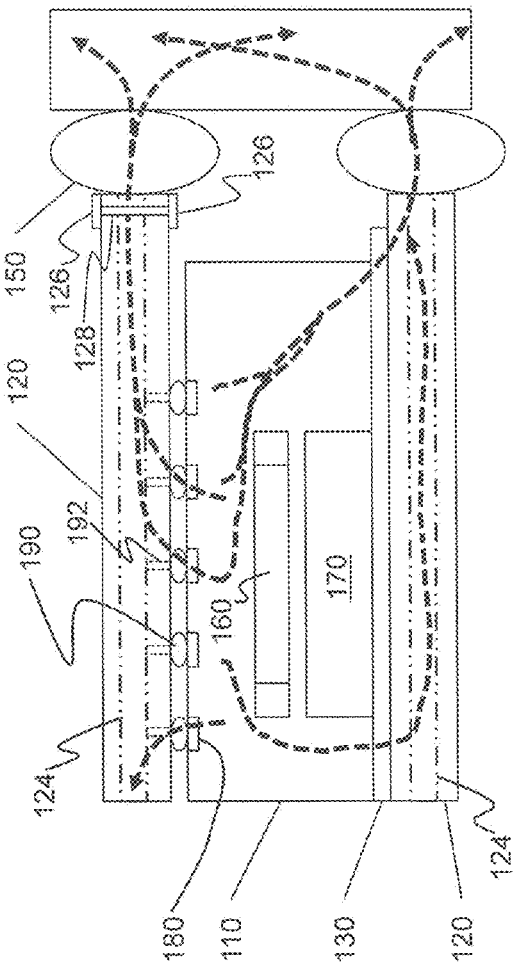

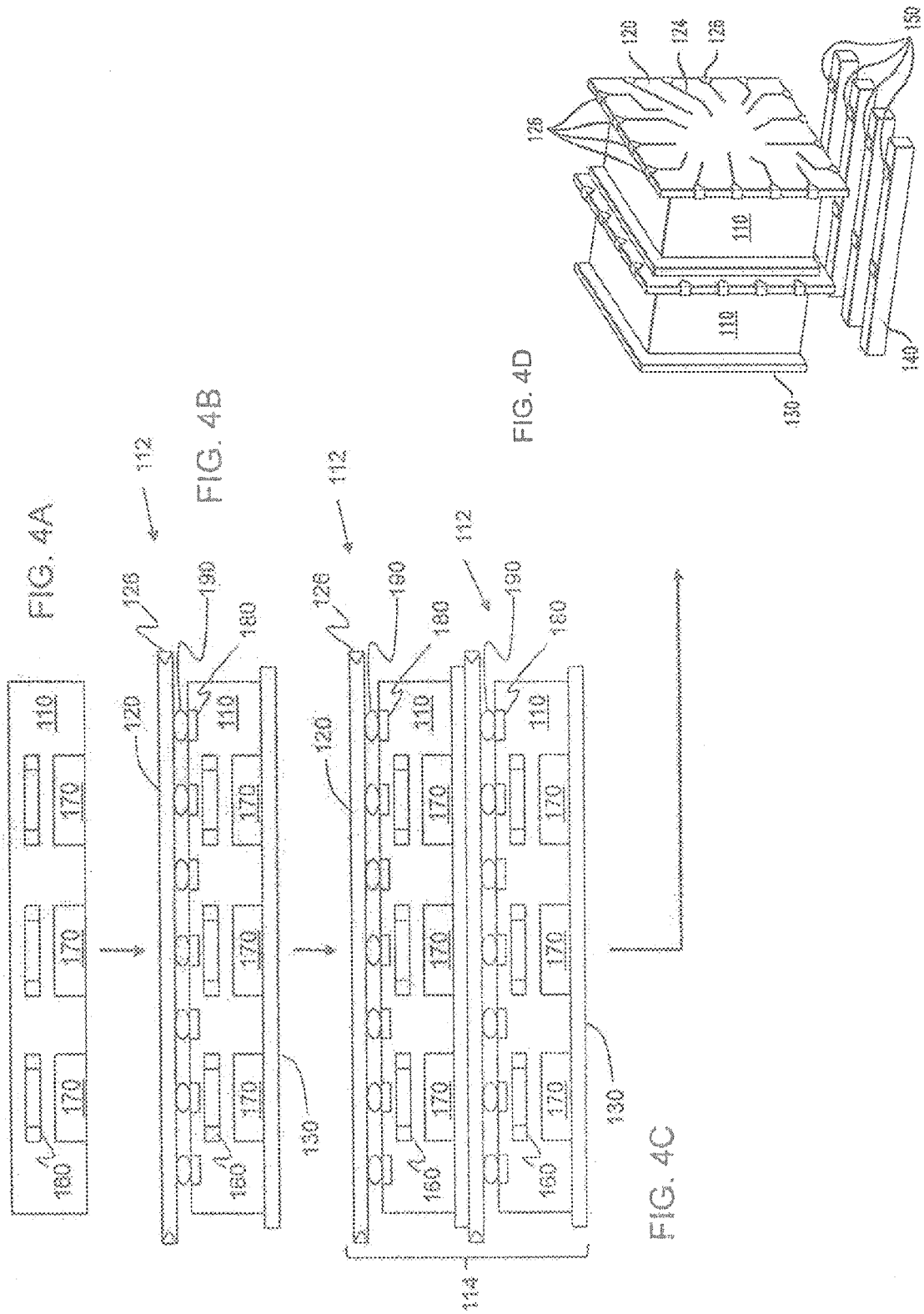

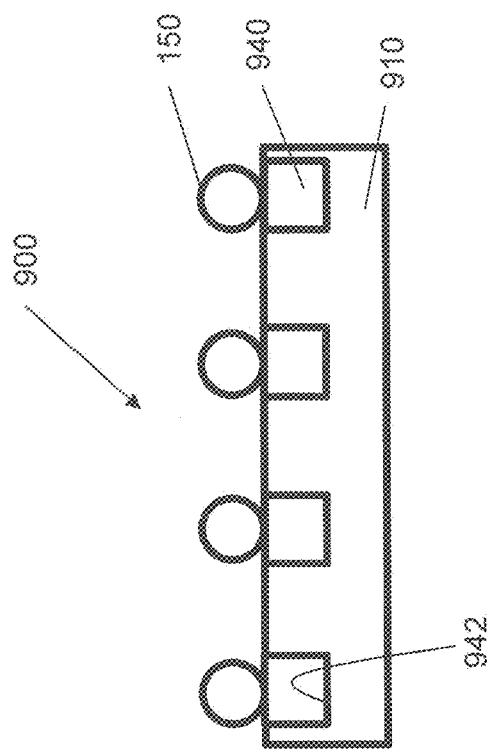
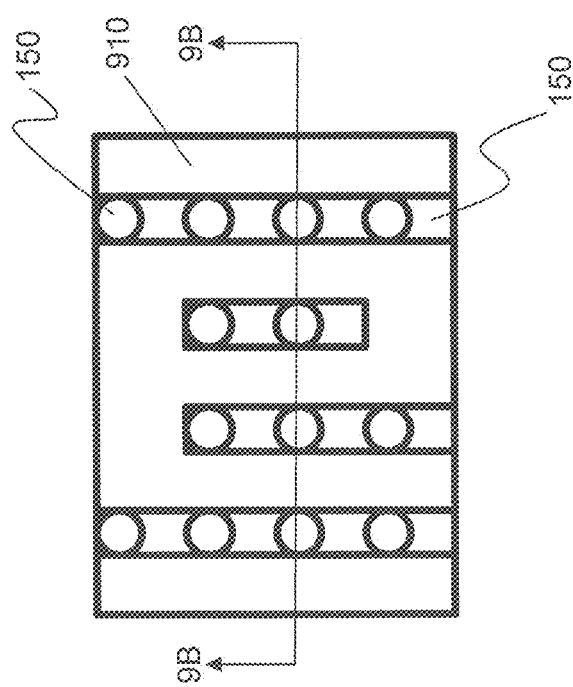

3D IC CONFIGURATION WITH CONTACTLESS COMMUNICATION

This application is a continuation of U.S. application Ser. No. 13/337,346, filed Dec. 27, 2011, which is expressly incorporated herein by reference in its entirety.

FIELD

This disclosure relates to semiconductor integrated circuit packaging generally, and more specifically to stacked die (3D IC) configurations.

BACKGROUND

A 3D IC package contains two or more integrated circuit dies (ICs) stacked vertically so that they occupy less space. Power and signal communication connections between the vertically stacked ICs may be made using through-semiconductor-vias, also referred to as through-silicon-vias (TSV), which pass through the entire thickness of a die, permitting connections between conductive patterns on the front face and back face of the die. The resulting package has no added length or width.

3D IC packages present new challenges for designers. The area of the chip that is used for TSVs is not available for other devices, reducing the available area for operational devices and spare cells.

If three or more dies are included in the stack, then all of the dies except for the topmost die and bottommost die (i.e., the interior dies) are sandwiched between other dies above and below. Because the semiconductor die materials are generally thermally insulating, heat dissipation presents a challenge in 3D ICs. It is not practical to provide a large heat spreader on the interior dies.

BRIEF DESCRIPTION OF THE DRAWINGS

FIG. 2 is a side elevation view of the 3D IC of FIG. 1.
FIG. 3 is an enlarged detail of FIG. 2.
FIGS. 4A-4D show various stages in the assembly of the package of FIG. 1.
FIGS. 9A-9B show a variation of the package of FIG. 7B

DETAILED DESCRIPTION

Figure 1:
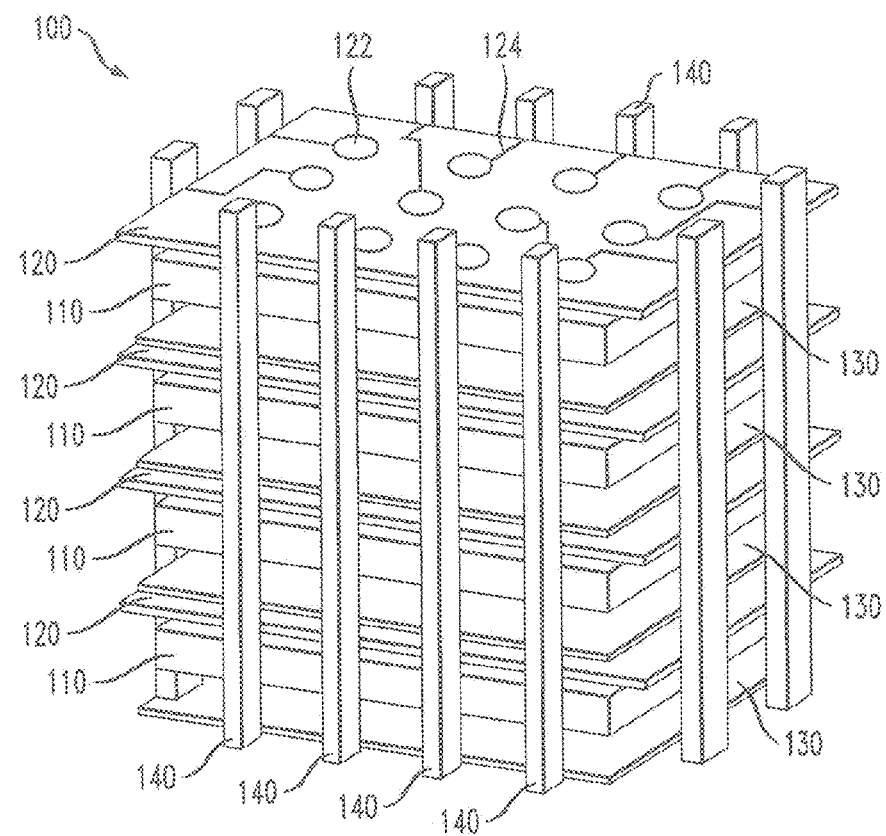
FIG. 1 is an isometric view of an embodiment of a 3D IC.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Embodiments are described herein of a 3D IC packaging technique adapted for stacked dies having contactless chip-to-chip signal communication. In some embodiments, the stacked dies within the 3D IC are configured with zero (or a reduced number of) through-substrate-vias (TSV) for contactless power delivery during testing. The technique addresses power supply and heat dissipation problems in stacked chips.

FIGS. 1-4D show a first embodiment of a 3D IC package 100. The 3D IC 100 comprises a die stack 114 having at least two stacked dies 110 coupled for contactless communications with each other. At least one of the stacked dies 110 has a substrate 120 joined to a major face of the die 110. The substrate 120 has a plurality of conductive traces 124 in or on the substrate for conducting power to the dies and for conducting heat from the dies.

At least one conductive pillar 140 is joined to at least one of the conductive traces 124 on at least a first edge of the substrate 120, for conducting power to the at least one die 110 and for conducting heat from the at least one die. In the example of FIG. 1, each side edge of the 3D IC has a plurality of conductive pillars 140, and each pillar is joined to a respective conductive trace 124 from each of the four substrates 120. Although FIG. 1 shows conductive pillars 140 on all four side edges of the 3D IC, in other embodiments, the conductive pillars may be arranged on one, two or three side edges. Although FIG. 1 shows four conductive pillars 140 on each long edge of the 3D IC, and 2 conductive pillars 140 on each short edge, the package may be configured with any number of pillars on the long edge and any number of pillars on the short edge.

The stacked package 100 includes a plurality of sub-assemblies 112 (FIG. 4B) stacked upon each other. Each sub-assembly includes an IC die 110 having a substrate 120 joined to its active face.

The IC die 110 may be formed in a semiconductor substrate of a variety of types. The substrate can be, for example, a silicon substrate, a III-V compound substrate, a glass substrate, or any other substrate suitable for IC fabrication. The substrate has a plurality of active devices (not shown), above which an interconnect structure is formed, to connect the active devices to pads 180 on the active face.

Each die 110 is configured for contactless communication with an adjacent die above and/or below. Each die 110 has at least one inductor (coil) 160 which is coupled by mutual inductance 162 (FIG. 2) with the corresponding adjacent inductor 160 of the adjacent die 110. Optionally, for enhancing the wireless communication, each inductor 160 may have a mass of a ferromagnetic material 170 adjacent to the inductor. In some embodiments, the ferromagnetic material 170 is located within each die so that one of the masses or ferromagnetic material 170 is interposed between each pair of adjacent inductors 160. In some embodiments, a mass of ferromagnetic material 170 is located outside of the space between the adjacent inductors. For example, in FIG. 2, the bottom die has ferromagnetic material 170 below the inductors 160. A variety of configurations and fabrication methods for the ferromagnetic material 170 may be used, such as, but not limited to, any of those described in U.S. patent application Ser. No. 13/206,584, filed Aug. 10, 2011, which is incorporated by reference herein in its entirety.

In one alternative embodiment (not shown), the dies 110 are configured with wireless transceivers for RF communication. In another alternative embodiment, the conductive pillars 140 are used for signal communications, as well as power.

Because the dies 110 are configured for contactless communication with each other, there is no need for TSVs for inter-die signal communications. Thus, the examples described herein also eliminate a need for TSVs to provide power to the dies, and to dissipate heat from the dies. With the elimination of TSVs, microbump issues during probe testing are also eliminated. Using contactless communication during testing, there is no need to contact fragile microbumps with a test probe.

The substrate 120 may be made of a variety of materials, such as, but not limited to a semiconductor, a glass, a polymer, a composite material, and a photosensitive dielectric material. The substrate may for example, be made of a material suitable for use as an IC package substrate, or a material suitable for printed circuit boards. Some example of dielectrics which may be used include, but are not limited to, "KAPTON®" polyimide film, sold by DuPont Corporation of Wilmington, Del., (or other suitable brand of polyimide) polytetrafluoroethylene ("TEFLON®"), FR-1, FR-2 (Phenolic cotton paper), FR-3 (Cotton paper and epoxy), FR-4 (Woven glass and epoxy), FR-5 (Woven glass and epoxy), FR-6 (Matte glass and polyester), G-10 (Woven glass and epoxy), CEM-1 (Cotton paper and epoxy), CEM-2 (Cotton paper and epoxy), CEM-3 (Woven glass and epoxy), CEM-4 (Woven glass and epoxy), CEM-5 (Woven glass and polyester).

In some embodiments, the substrate 120 is a redistribution layer formed on the active face of the die 110. The redistribution layer may be formed by forming a fan-out wafer including the dies 110, and applying a photosensitive (patternable) dielectric material over the dies 110.

In some embodiments, such as in the case of a polymer or composite substrate 120, the substrate 120 has a plurality of conductive traces 124 buried between the top and bottom layers at the major faces of the substrate 120, and/or on the active face of the substrate 120, which faces the IC die 110. The conductive traces 124 are connected to bumps 190 for joining the substrate 120 to the IC die 110. As best seen in FIG. 4D, the conductive traces 124 lead to pads 126 on the perimeter of the substrate 120. If the conductive traces 124 are sandwiched between dielectric layers within the substrate 120 (as shown in FIG. 3), the conductive traces 124 and the bumps 190 or pads 122 are connected by way of conductive vias 192. Also, at the perimeter of the substrate, vias 128 connect the conductive traces 124 to the pads 126 for joining with bumps 150.

As best seen in FIGS. 3 and 4B-4C, the conductive traces 124 are connected to bumps 190 or pads 122 at a major surface of the substrate 120 facing the at least one stacked die, and the bumps 190 or pads 122 are joined to corresponding bumps or pads 180 on the active major face of the die 110. Thus, the connections between pads 180 and bumps 190 provide a heat conduction path from the heat dissipating circuitry of die 110 and into the conductive traces 124 of the substrate 120. Thus, as shown by the bold dashed lines in FIG. 3, the heat from the die 110 is conducted through the pads 180, bumps 190, vias 192 and conductive trace 124 to the periphery of the substrate 120.

As shown in FIGS. 1 and 4D, at least one conductive pillar 140 is provided. The example of FIG. 1 has a plurality of conducive pillars 140. At least one of the plurality of conductive pillars 140 is joined to one of the conductive traces 124 on an edge of the at least one die. The conductive pillar 140 is an elongated metal member having a longitudinal axis A (FIG. 1) arranged orthogonal to the major face of the at least one die. The conductive pillar 140 is joined by solder 150 or copper bumps to the at least one conductive trace 124 (by way of pad 126 and via 128). In the example, each side of the 3D IC includes a respective plurality of conducive pillars 140 joined to respective conductive traces 124 on the substrates 120 joined to each respective edge of each of the at least two stacked dies.

The conductive pillars are sized with a cross sectional area sufficient to provide a highly conductive path for power and heat dissipation. For example, the cross-sectional width and thickness of the conductive pillars 140 may be about 15 micrometers or more. The height of the conductive pillars 140 may be selected to accommodate as many dies as are to be included in the package. In some embodiments, the conductive pillars 140 are made of a highly conductive material, such as copper, gold or aluminum. The conductive pillars may be extruded, molded, cast, cut or stamped, for example. The pillars 140 may have a rectangular or square cross-section. Alternatively, other cross sections, such as trapezoid, or semi-circle may be used.

In the example of FIGS. 1-4D, the conductive pillars 140 are formed of separate pieces of material, and are positionable independently from each other. Each of the pillars 140 has at least one solder (or copper) pre-form or bump 150 (FIG. 4D) on one side. The solder bumps 150 are arranged so that their spacing matches the spacing between successive substrates 120 corresponding to adjacent dies 110. During the assembly process, the pillars 140 may be joined individually. Alternatively, all of the pillars for one side of the 3D IC may be fixtured with the desired relative positions, and joined at the same time (as shown in FIG. 4D). Alternatively, all of the pillars 140 for two, three or four sides of the IC may be fixtured for simultaneous attachment. The pillars for one or more sides are held in position with the bumps 150 adjacent the pads 126, and the pillars are heated to reflow the solder 150.

Figure 5:
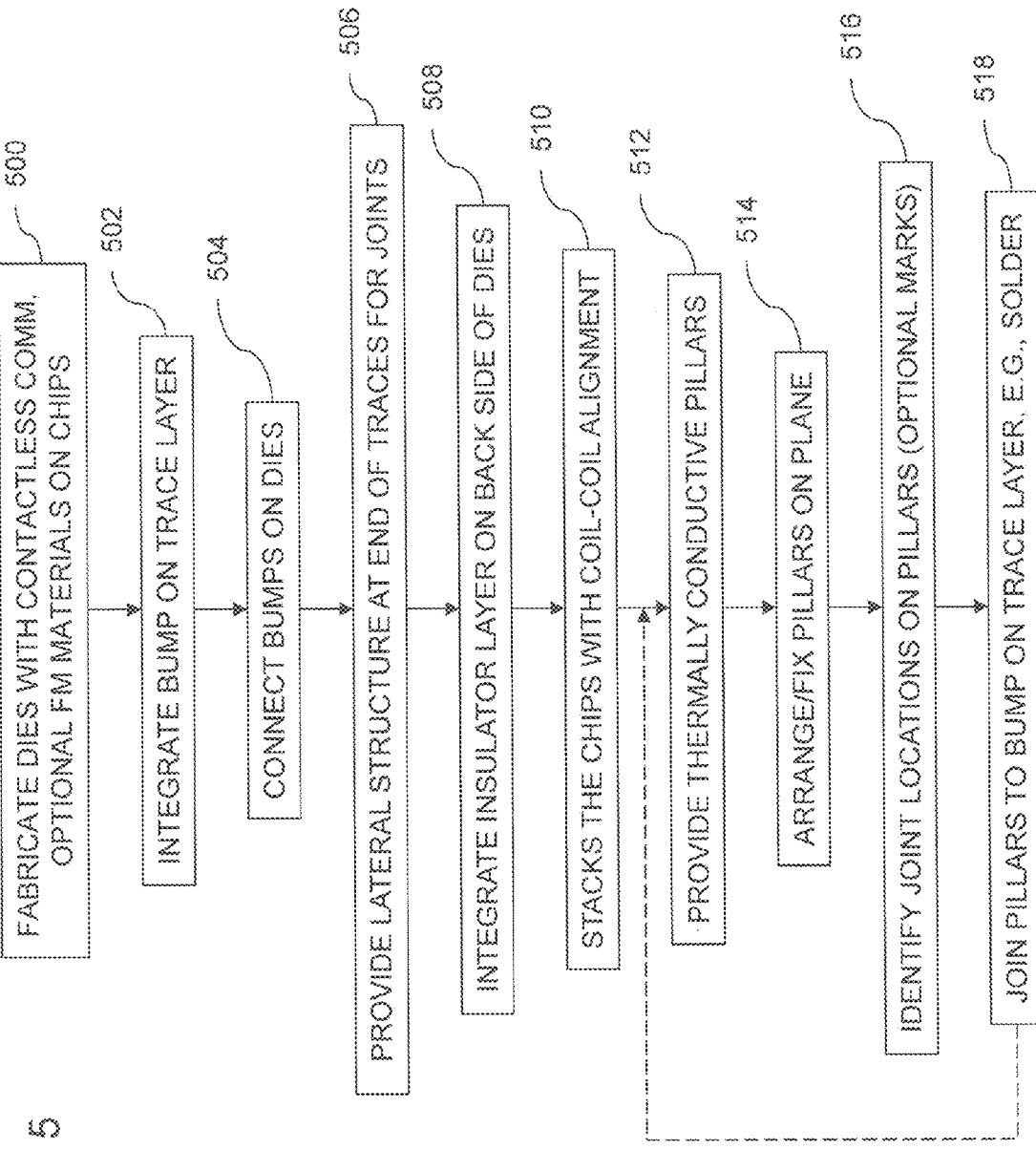
FIG. 5 is a flow chart of a method for assembling the 3D IC package of FIG. 1.

FIGS. 4A-4D show a method of packaging the 3D IC of FIG. 1. FIG. 5 is a flow chart describing this method.

At step 500, a plurality of dies 110 are fabricated. Each die is configured for contactless communication, for example, including one or more coils 160 for communicating with adjacent dies. Optionally, each die is provided with a mass of ferromagnetic material 170 for enhancing the contactless communication. The dies are tested, and are considered known good dies (KGD). The configuration of one of the dies at this stage is shown in FIG. 4A.

At step 502, a corresponding substrate (bump on trace layer) 120 is integrated onto each respective die 110. The substrates may be formed by a process similar to that used for a printed circuit board. Alternatively, the substrate 120 may be a semiconductor fabricated with interconnect (BEOL) layers, but no active devices (similar to a process for fabricating a silicon interposer). In some embodiments, the locations of the pads 126 along the edges of substrate 120 are the same in each substrate 120 (even if the dies 110 contain different internal circuitry to perform different functions). This permits the same conductive pillar 140 to form connections to two or more of the pads 126. In other embodiments, the pillars 140 are widened, to allow some relative displacements between the locations of pads 126 in successive dies. So long as the offset between corresponding pads in adjacent dies is less than the width of the pillars 140, contact can be made.

Once fabricated, the substrate 120 is joined to the die 110. For example, die 110 may be flip-chip mounted on substrate 120. At step 504, the solder bumps 190 are reflowed to form electrical and thermal connections between the pads 180 of die 110 and the bumps 190 of the substrate 120.

In other embodiments, instead of providing separate substrate 120 of semiconductor or circuit board material and reflowing the bumps 190, the substrate 120 is a redistribution layer formed by depositing and patterning a photosensitive dielectric material over the die 110.

Figure 11B:
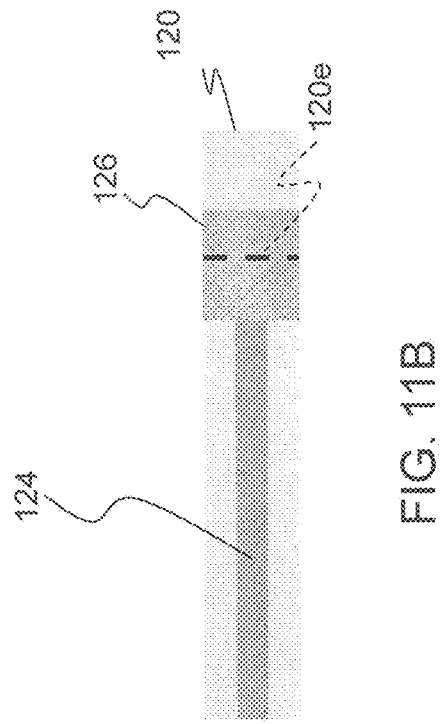
FIGS. 11A and 11B are plan and side edge elevation views showing steps of fabricating the substrates of FIG. 1.
Figure 11A:
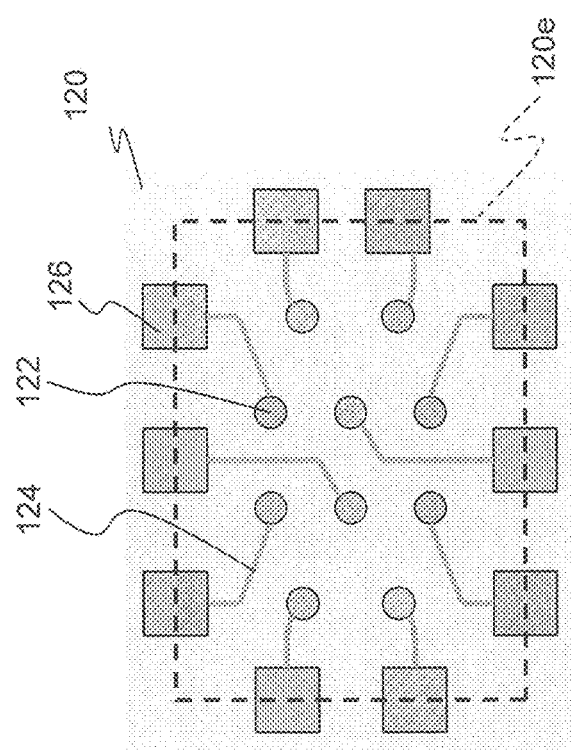

At step 506, the lateral structures or pads 126 are provided for forming interconnections between the bumps 150 and the conductive pillars 140. When forming the metal on the side edge of substrate 120, a small trench (lateral) can be formed for holding the joint. FIGS. 11A and 11B show a method for making the lateral pad 126 at the edge of the substrate for the joint. A metal pad 126 may be formed with a conductive via going through the substrate 120 from top to bottom while making the substrate. Then, the edges are trimmed at the dashed line 120e so that the metal pad 126 is exposed for connecting the pillars.

At step 508, an insulator layer 130 is integrated onto the back side of each die. The insulator 130 may be a thermal interface material (TIM). The thermal interface material 130 (optional) may be a soft polymer, such as a polyimide. The insulator 130 may be attached with a thin layer of adhesive, for example. At the conclusion of step 508, each sub-assembly 112 is configured as shown in FIG. 4B.

At step 510, the sub-assemblies are stacked, so as to provide a die stack 114 having at least two stacked dies 110 coupled for contactless communications with each other. At least one of the stacked dies 110 has a substrate 120 joined to a major face thereof. The substrate 120 has a plurality of conductive traces 124 therein for conducting power to the dies and for conducting heat from the dies. The dies 110 may be fixtured to maintain proper alignment. The die stack 114 at the completion of this step is shown in FIG. 4C.

At step 512, the conductive pillars 140 are provided. Pillars 140 may be formed of separate pieces of material, positionable independently from each other. The pillars may be extruded, molded, cast, cut, stamped, or otherwise formed from a conductive material, such as copper, gold or aluminum, for example. As shown in FIG. 4D, each pillar 140 has solder bumps 150 thereon, with spacing between the solder bumps corresponding to the distance between successive substrates 120 in the die stack 114.

At step 514, the pillars 140 for each side of the 3D IC are arranged and aligned with the desired spacing between them. The spacing between pillars 140 corresponds to the distance between the pads 126 corresponding to successive conductive traces 124 along an edge of the substrate 120. The pillars 140 may be placed on a carrier substrate (e.g., a glass sheet) and held in place with a dissolvable adhesive tape, to maintain alignment during the interconnection process. The configuration of die stack 114 and pillars 140 at this stage is shown in FIG. 4D.

At step 516, the joint locations of the pillars (where bumps 150 are positioned) are identified and aligned with the pads 126 of the die stack 114.

At step 518, each conductive pillar 140 is joined to a respective conductive trace of each respective substrate, by reflowing the bumps 150 to form interconnections with the pads 126. In alternative embodiments, instead of solder, conductive epoxy may be used. The pillars 140 are now configured for conducting power to the dies 110 and for conducting heat from the dies. The carrier (not shown) is removed from the pillars 140, for example by dissolving the adhesive holding the pillars to the carrier.

In some embodiments, steps 512-518 are repeated for each side of the 3D IC. FIG. 1 shows the completed configuration with the conductive pillars 140 on all four sides of the die stack 114. The space between the pillars 140 is filled with a protective material, such as an underfill or encapsulant. The top surface of the 3D IC is exposed, with pads 122 on the active face. The conductive pillars 140 project from the top and/or bottom of the 3D IC.

In alternative embodiments, the pillars 140 are only provided on one, two or three sides of the die stack 114.

Figure 6:
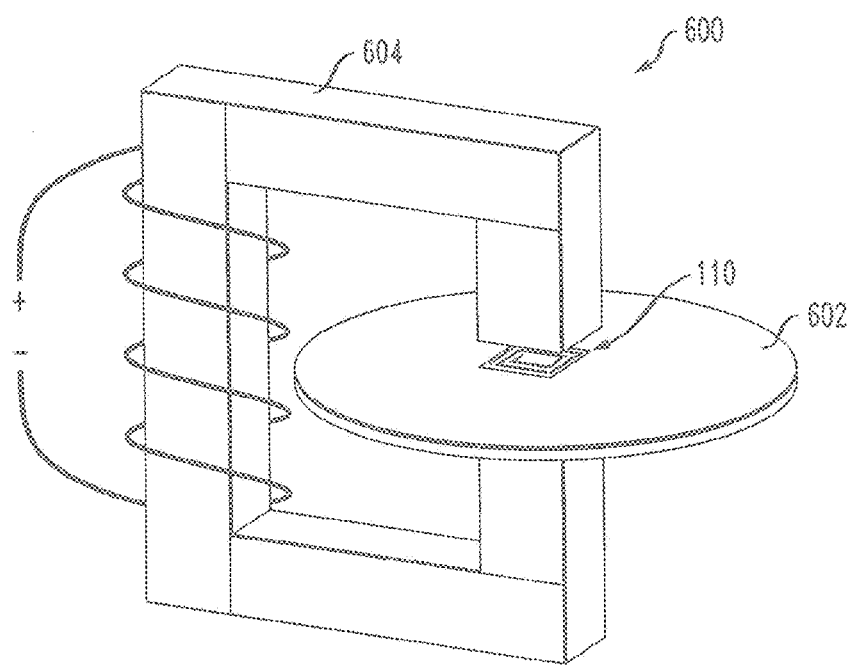
FIG. 6 is a schematic diagram of a test configuration for contactless communication with the ICs of FIG. 1, prior to packaging.

FIG. 6 is a schematic diagram showing a test configuration 600 of one of the individual dies prior to assembling the die stack. One of the dies 110 is shown on a stage 602 or other test configuration (or item 602 may be a wafer on which a die is formed), with a coil 604 for providing power to the die 110 by contactless delivery. The coil 604 may be a ferromagnetic arm and pole.

Contactless power delivery using the magnetic coupling effect is used during testing before the dies 110 are stacked. The die and the on-chip coil 160 receive the power from the power source by way of the ferromagnetic arms and poles 604. Communications with the die during testing are also by contactless communication. There is no need to contact any microbumps on the die 110 for probe testing.

Figure 7A:
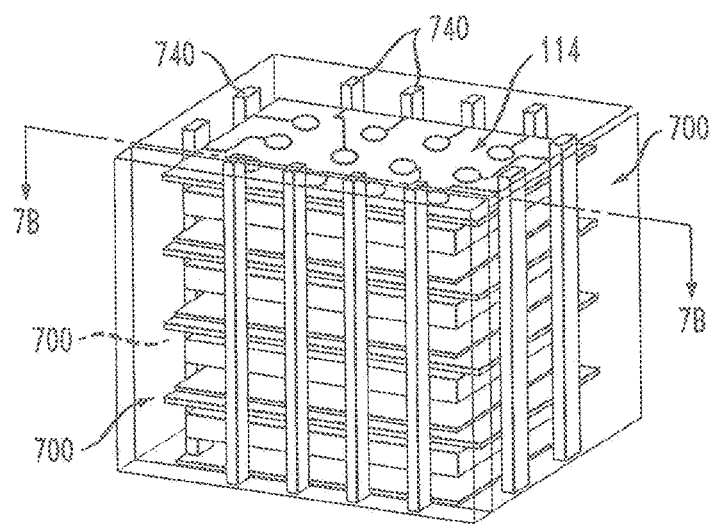
FIGS. 7A-7B show a variation of the package in FIG. 1.
Figure 7B:
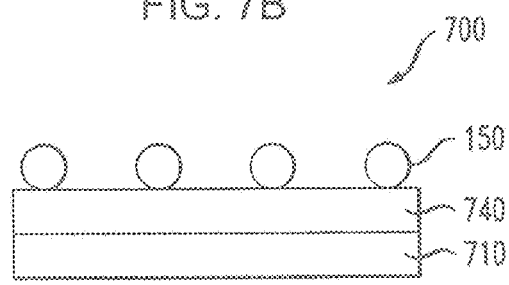

FIGS. 7A and 7B show a variation of the packaging method. In the embodiment of FIGS. 7A and 7B, the die stack 114 may be the same configuration as shown in FIG. 4C. A description of the die stack 114 and its fabrication method is not repeated for brevity.

Instead of a plurality of separate pillars 140, at least one substrate 700 is provided, as shown in FIG. 7B. The substrates 710 include a base layer 710, which may comprise a flexible printed circuit board material, such as polyimide (KAPTON® brand or other suitable polyimide). Any of the other substrate materials described above with reference to substrate 120 may also be used, such as polytetrafluoroethylene, FR-1, FR-2, FR-3, FR-4, FR-5, FR-6, G-10, CEM-1, CEM-2, CEM-3, CEM-4, or CEM-5.

The pillars 740 of FIGS. 7A and 7B are patterned on the substrates 710 by a printed circuit patterning process. For example, the substrates 710 may be provided with a copper layer on one face. A mask (not shown) is applied and the pillars 740 are formed by removing the copper layer, except where the pillars 740 are to be formed. In alternative embodiments, bare substrates 710 are patterned to add copper pillars 740. In either case, once the pillars 740 are formed, the solder bumps 150 are applied. The substrates 700 are joined to the die stack 114 without the step of joining the individual separate pillars to a carrier (as discussed with reference to FIG. 5).

The package thus formed has a die stack 114 having at least two stacked dies 110 coupled for contactless communications with each other. Each stacked die includes a respective inductor configured for contactless communication with an adjacent one of the stacked dies, and a portion of ferromagnetic material positioned near the inductor. Each of the stacked dies 110 has a respective substrate 120 joined to a major face thereof. Each substrate 120 comprises at least one of the group consisting of a glass, a polymer, and a photosensitive dielectric material. Each substrate 120 has a plurality of conductive traces 124 therein for conducting power to the dies and for conducting heat from the dies. The conductive traces 124 are connected to bumps 190 or pads 122 at a major surface of each substrate 120 facing a respective one of the stacked dies 110. The bumps 190 or pads 122 are joined to corresponding bumps or pads 180 on the major face of each die. A dielectric substrate 710 has formed at a surface thereof a plurality of conductive pillars 740. The pillars 740 are joined to respective conductive traces 124, 126 on each respective edge of each of the at least two stacked dies 110. Each conductive pillar 740 is an elongated metal member having a longitudinal axis arranged orthogonal to the major face of the at least one die 110. The conductive pillars 740 are formed on or in a surface of at least one dielectric substrate 710, for conducting power to the at least one die and for conducting heat from the at least one die.

Figure 8:
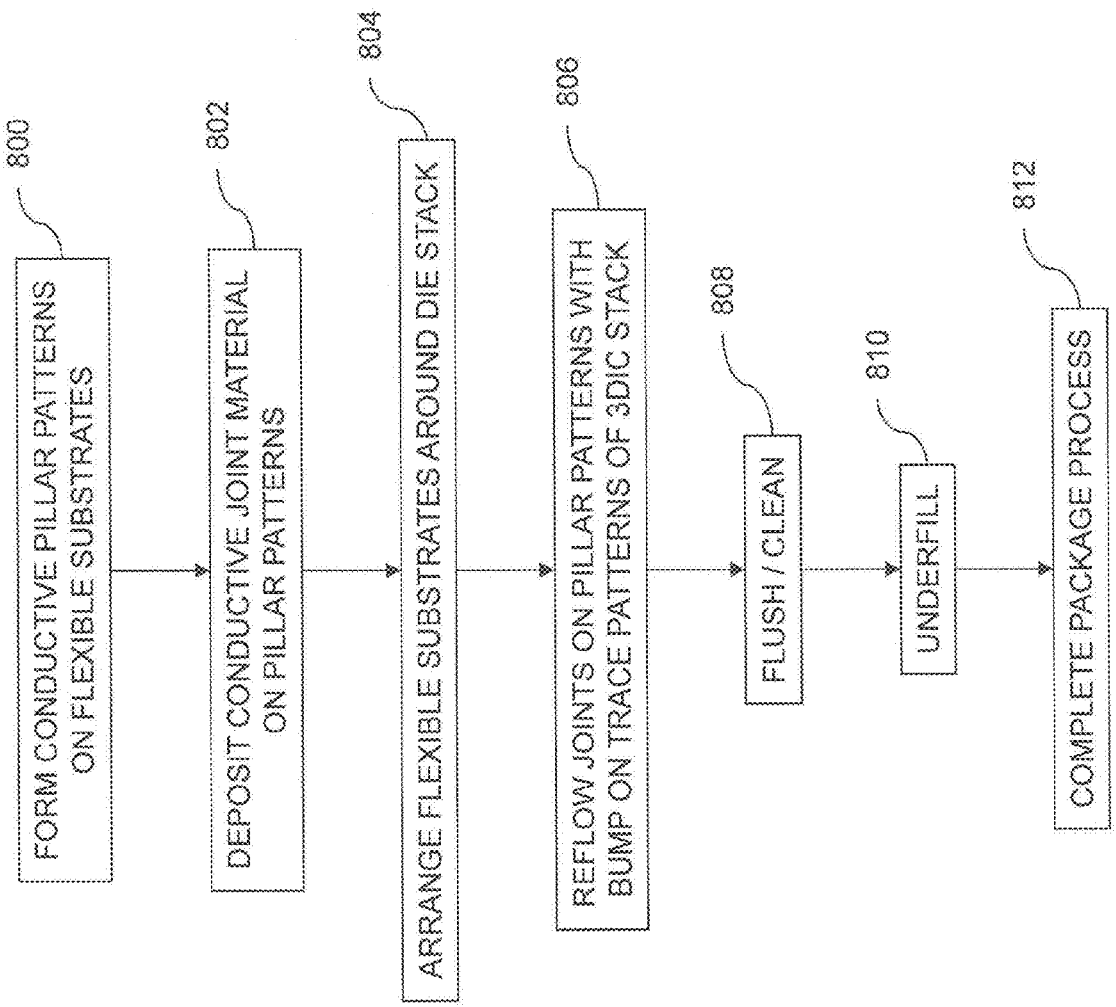
FIG. 8 is a flow chart of the method of assembling the package of FIG. 7B.

FIG. 8 is a flow chart of the method for fabricating the 3D IC of FIGS. 7A, 7B.

At step 800, a plurality of conductive pillars 740 are formed at a surface of a dielectric substrate 710, for example by subtractive etching a copper layer on the substrate 710. The step of forming a plurality of conductive pillars is repeated for each respective side of the die stack.

At step 802, a conductive joint material (e.g., solder) is deposited on the pillar patterns 740.

At step 804, the flexible substrates 700 are arranged around the die stack 114.

At step 806, the solder bumps 150 are reflowed, so that the dielectric substrates 700 are joined to the die stack 114, and each of the conductive pillars 740 makes electrical and thermal contact with a respective conductive trace 124 in each one of the sub-assemblies 112. This step is performed for each respective side of the die stack.

At step 808, the assembly is flushed (e.g, with deionized water or other solvent).

At step 810, an underfill is applied to fill the interstices in the package.

At step 812, the packaging process is completed.

Figure 10:
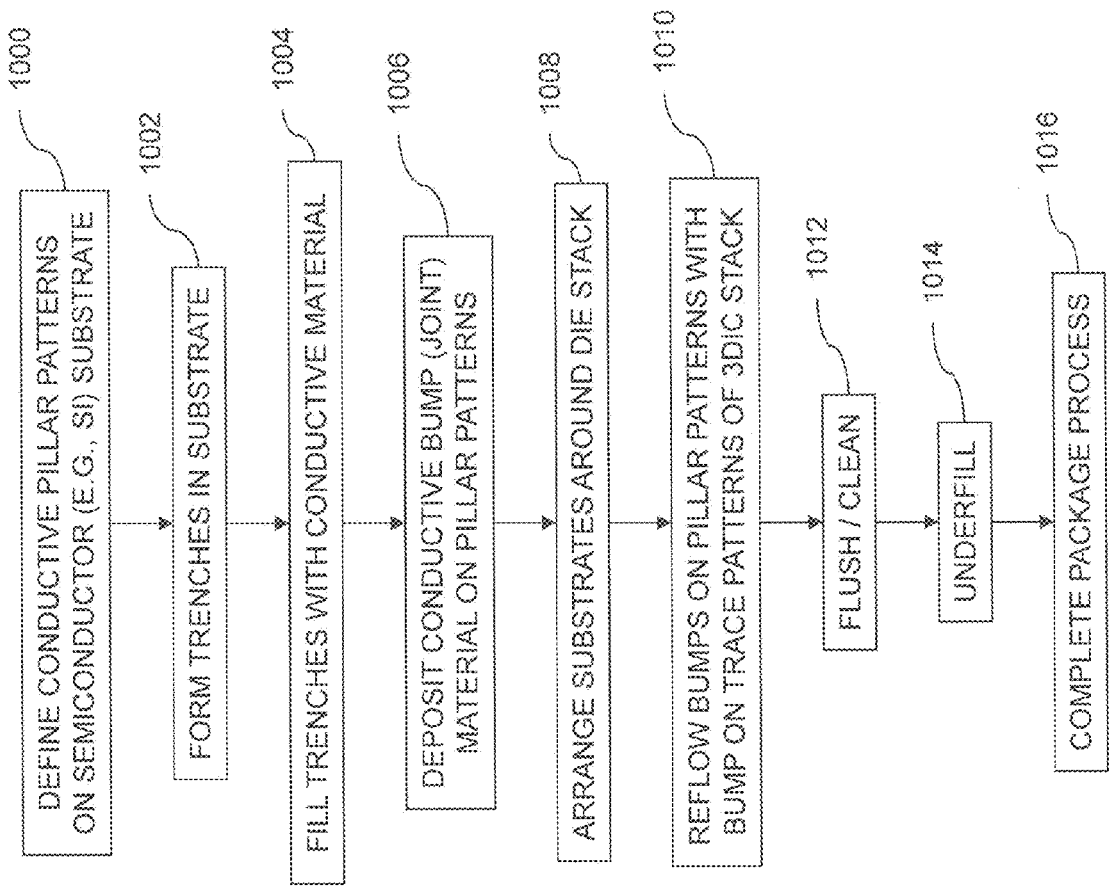
FIG. 10 is a flow chart of the method of assembling the package of FIG. 9B.

FIGS. 9A, 9B and 10 show an alternative method for providing the substrates 900 with the pillars 940 formed at the surface of the substrate. In this variation, the pillars 940 are formed in the surface of a semiconductor substrate 910 (e.g., bare silicon, or silicon covered with a dielectric, such as a silicon oxide) using a single damascene process. Then bumps 150 are applied. An advantage of using a silicon substrate 910 is that the coefficient of thermal expansion of the substrate 910 is the same as that of a bulk silicon substrate in die 110.

Referring to FIG. 10, at step 1000, pillar patterns are defined on the silicon substrate 910. For example, a photoresist layer (not shown) may be applied on the substrate, exposed through a photomask, and unwanted portions of the photoresist removed.

At step 1002, trenches 942 are formed in the substrate by etching through the patterns in the mask.

At step 1004, the trenches 942 are filled with conductive material, such as copper, to form the conductive pillars 940.

At step 1006, the conductive joint material (bumps) 150 is formed on the conductive pillars 940.

At step 1008, the semiconductor substrates 900 are arranged around the die stack 114 of FIG. 4C.

At step 1010, the solder bumps 150 are reflowed, so that the substrates 900 are joined to the die stack 114, and each of the conductive pillars 940 makes electrical and thermal contact with a respective conductive trace 124 in each one of the sub-assemblies 112. This step is performed for each respective side of the die stack.

At step 1012, the assembly is flushed (e.g, with deionized water or other solvent).

At step 1014, an underfill is applied to fill the interstices in the package.

At step 1016, the packaging process is completed.

In some embodiments, a package, comprises a die stack having at least two stacked dies coupled for contactless communications with each other. At least one of the stacked dies has a substrate joined to a major face thereof. The substrate has a plurality of conductive traces in or on the substrate for conducting power to the dies and for conducting heat from the dies. At least one conductive pillar is joined to at least one of the conductive traces on at least a first edge of the substrate, for conducting power to the at least one die and for conducting heat from the at least one die.

In some embodiments, a package, comprises a die stack having at least two stacked dies coupled for contactless communications with each other. Each of the stacked dies has a respective substrate joined to a major face thereof. Each substrate comprises at least one of the group consisting of a glass, a polymer, and a photosensitive dielectric material. Each substrate has a plurality of conductive traces therein for conducting power to the dies and for conducting heat from the dies. The conductive traces are connected to bumps or pads at a major surface of each substrate facing a respective one of the stacked dies, and the bumps or pads are joined to corresponding bumps or pads on the major face of each die. A dielectric substrate has formed at a surface thereof a plurality of conductive pillars. The pillars are joined to respective conductive traces on each respective edge of each of the at least two stacked dies. Each conductive pillar is an elongated metal member having a longitudinal axis arranged orthogonal to the major face of the at least one die, and the conductive pillars are formed on or in a surface of at least one dielectric substrate for conducting power to the at least one die and for conducting heat from the at least one die.

In some embodiments, a method comprises: providing a die stack having at least two stacked dies coupled for contactless communications with each other, at least one of the stacked dies having a substrate joined to a major face thereof, the substrate having a plurality of conductive traces therein for conducting power to the dies and for conducting heat from the dies; and joining at least one conductive pillar to at least one of the conductive traces at least at a first edge of the substrate, for conducting power to the at least one die and for conducting heat from the at least one die.

Although the subject matter has been described in terms of exemplary embodiments, it is not limited thereto. Rather, the appended claims should be construed broadly, to include other variants and embodiments, which may be made by those skilled in the art.

What is claimed is:

1. A method comprising:
   providing a die stack having at least two stacked dies coupled for contactless communications with each other, at least one of the stacked dies having a stacked die substrate joined to a major face thereof, the stacked die substrate having a plurality of conductive traces therein for conducting power to the at least one stacked die and for conducting heat from the at least one stacked die;
   forming a plurality of conductive pillars on a surface of a dielectric substrate; and
   joining the dielectric substrate to a side edge of the die stack, with the dielectric substrate normal to the stacked die substrate, such that each of the conductive pillars makes electrical and thermal contact with a respective conductive trace in each of the at least one stacked die substrate, for conducting power to the at least one stacked die and for conducting heat from the at least one stacked die.

2. The method of claim 1, wherein the substrate comprises at least one of the group consisting of a glass, a polymer, and a photosensitive dielectric material.

3. The method of claim 1, wherein the conductive traces are connected to bumps or pads at a major surface of the substrate facing the at least one stacked die, and the bumps or pads are joined to corresponding bumps or pads on the major face of the die.

4. The method of claim 1, wherein at least one of the plurality of conductive pillars is joined to one of the conductive traces on a second edge of the at least one die.

5. The method of claim 4, wherein the conductive pillars are joined by solder to the conductive traces.

6. The method of claim 4, wherein the conductive pillars are joined to respective conductive traces on each respective edge of a respective substrate attached to each of the at least two stacked dies.

7. The method of claim 1, wherein:
the at least one of the stacked dies includes each of the stacked dies, and the substrate includes a respective substrate corresponding to each respective stacked die;
each substrate comprises at least one of the group consisting of a glass, a polymer, and a photosensitive dielectric material;
the conductive traces are connected to bumps or pads at a major surface of each substrate facing a respective one of the stacked dies, and the bumps or pads are joined to corresponding bumps or pads on the major face of each die;
the plurality of conducive pillars are joined to respective conductive traces on each respective edge of each of the at least two stacked dies, each conductive pillar being an elongated metal member having a longitudinal axis arranged orthogonal to the major face of the at least one die.

8. A method comprising:
(a) delivering power to a first die by contactless delivery during testing and communicating with the first die by contactless communication during the testing;
(b) providing a die stack including the first die after step (a), the die stack having at least two stacked dies coupled for contactless communications with each other, at least one of the stacked dies having a substrate joined to a major face thereof, the substrate having a plurality of conductive traces therein for conducting power to the dies and for conducting heat from the dies; and
(c) joining at least one conductive pillar to at least one of the conductive traces at least at a first edge of the substrate, for conducting power to the at least one die and for conducting heat from the at least one die.

9. The method of claim 8, wherein the joining step includes joining a plurality of conductive pillars to a respective plurality of conductive traces on at least one of the edges of the respective substrate attached to each of the at least two stacked dies.

10. The method of claim 8, wherein each of the stacked dies has at least one inductor, which is coupled by mutual inductance with the corresponding adjacent inductor of an adjacent one of the stacked dies.

11. The method of claim 10, wherein each of the stacked dies has a ferromagnetic material located, so that a respective one of the masses of ferromagnetic material is interposed between each respective pair of adjacent inductors.

12. The method of claim 11, wherein one of the stacked dies has the ferromagnetic material thereof located outside of any space between the pairs of adjacent inductors.

13. The method of claim 8, wherein the providing step includes:
forming a plurality of sub-assemblies, each sub-assembly including a respective die and a respective substrate joined to the major face of that die, wherein the conductive traces are connected to bumps or pads at a major surface of the substrate facing the respective stacked die, and the bumps or pads are joined to corresponding bumps or pads on the major face of the die; and
stacking the sub-assemblies to form the die stack.

14. The method of claim 13, wherein the substrate comprises at least one of the group consisting of a glass, a polymer, and a photosensitive dielectric material.

15. The method of claim 8, wherein the joining step includes joining at least one conductive pillar to at least one respective conductive trace on each respective edge of a respective substrate attached to each of the at least two stacked dies.

16. A method comprising:
providing a die stack having at least two stacked dies coupled for contactless communications with each other, at least one of the stacked dies having a substrate joined to a major face thereof, the substrate having a plurality of conductive traces therein for conducting power to the dies and for conducting heat from the dies; and
forming a plurality of conductive pillars in a surface of a semiconductor substrate by a damascene process; and
joining at least one of the conductive pillars to at least one of the conductive traces at least at a first edge of the substrate, for conducting power to the at least one die and for conducting heat from the at least one die.

17. The method of claim 16, wherein the semiconductor substrate comprises bare silicon or silicon covered with a dielectric material.

18. The method of claim 16, further comprising forming solder bumps on the conductive pillars, wherein the joining step includes reflowing the solder bumps.

19. The method of claim 16, further comprising applying an underfill to fill a plurality of interstices in a package formed by the providing, forming and joining steps.

20. The method of claim 16, wherein the semiconductor substrate comprises bare silicon or silicon covered with a dielectric material, further comprising
forming solder bumps on the conductive pillars, wherein the joining step includes reflowing the solder bumps; and
applying an underfill to fill a plurality of interstices in a package formed by the providing, forming and joining steps.

* * * * *